(12) United States Patent
Yamasaki et al.

(10) Patent No.: US 7,456,109 B2
(45) Date of Patent: Nov. 25, 2008

(54) METHOD FOR CLEANING SUBSTRATE PROCESSING CHAMBER

(75) Inventors: Hideaki Yamasaki, Nirasaki (JP); Kazuhito Nakamura, Nirasaki (JP); Koumei Matsuzawa, Nirasaki (JP); Tsukasa Matsuda, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/536,322

(22) PCT Filed: Nov. 14, 2003

(86) PCT No.: PCT/JP03/14519

§ 371 (c)(1), (2), (4) Date: May 26, 2005

(87) PCT Pub. No.: WO2004/049421

PCT Pub. Date: Jun. 10, 2004

(65) Prior Publication Data

US 2006/0124151 A1 Jun. 15, 2006

(30) Foreign Application Priority Data

Nov. 27, 2002 (JP) .............................. 2002-344457

(51) Int. Cl.
*H01L 21/302* (2006.01)
(52) U.S. Cl. ........................... 438/706; 438/706; 438/9; 438/723; 438/726; 438/727; 216/37; 216/67; 134/1.1; 134/22.1; 134/22.18
(58) Field of Classification Search .................. 134/1.1; 216/37; 438/706
See application file for complete search history.

(56) References Cited

U.S. PATENT DOCUMENTS 5,788,778 A * 8/1998 Shang et al. ................... 134/1
6,068,729 A * 5/2000 Shrotriya ............... 156/345.26

FOREIGN PATENT DOCUMENTS

| JP | 10/149989 | 6/1998 |
|---|---|---|
| JP | 2000-353683 | 12/2000 |
| JP | 2002-184765 | 6/2002 |
| JP | 2002-280376 | 9/2002 |
| JP | 2004-179426 | 6/2004 |
| WO | 02/078073 | 10/2002 |

* cited by examiner

*Primary Examiner*—Duy-vu N. Deo
*Assistant Examiner*—Maki Angadi
(74) *Attorney, Agent, or Firm*—Oblon, Spivak, McClelland, Maier & Neustadt, P.C.

(57) ABSTRACT

A cleaning method of a substrate processor that reduces damage to a member in a substrate processing container. The method of cleaning the substrate processing container of the substrate processor that processes a target substrate according to the present invention includes: introducing gas into a remote plasma generating unit of the substrate processor; exciting the gas by the remote plasma generating unit, and generating reactive species; and supplying the reactive species to the processing container from the remote plasma generating unit, and pressurizing the processing container at 1333 Pa or greater.

7 Claims, 11 Drawing Sheets

METHOD FOR CLEANING SUBSTRATE PROCESSING CHAMBER

BACKGROUND OF THE INVENTION

1. Field of the Invention

The present invention generally relates to a cleaning method of a substrate processing container of a substrate processor, and especially relates to a cleaning method of a membrane formation apparatus by remote plasma generation.

2. Description of the Related Art

In a substrate processor that forms a membrane on a target substrate, for example, a CVD (chemical vapor deposition) apparatus, the target substrate is laid in a substrate processing container, and predetermined membrane formation is performed. There being a huge number of examples of thin films formed on substrates, deposits are also made (thin films are also formed) on the inner wall and members, such as a substrate holding stand, of the substrate processing container. Such undesired deposits become thicker as membrane formation is repeated, and the undesired thin films will be exfoliated. Such exfoliated sediment floats in the substrate processing container, and is taken into the thin film to be formed on the substrate during the membrane formation process. This degrades the quality of the thin film, and is a problem.

In order to cope with the problem, a cleaning method of removing sediment as described above from a substrate processing container is proposed (for example, JPA 10-149989). According to the cleaning method, a remote plasma generating unit for generating fluorine radicals for cleaning is prepared outside of the substrate processing container, wherein $NF_3$ is excited by 2.45 GHz microwave power so that the fluorine radicals are generated. Then, the fluorine radicals are introduced into the substrate processing container such that the sediment is made to evaporate and be discharged out of the substrate processing container.

SUMMARY OF THE INVENTION

However, according to the cleaning method disclosed by JPA 10-149989, the fluorine radicals (F*) are mainly used as reaction species for cleaning; for this reason, where a member made of quartz is present in the substrate processing container, there is a problem in that the quartz member is etched by the fluorine radicals. Furthermore, when ceramic members, such as AlN and $Al_2O_3$, are present in the substrate processing container, they are also etched, but to a lesser degree than the quartz by a large amount of the fluorine radicals. Then, the ceramics etched by the fluorine radicals form, for example, a compound of aluminum, and the compound remains in the substrate processing container. There is a possibility that the compound will be taken into the thin film to be formed in the membrane (thin film) formation process, such contamination degrading the quality of the thin film.

Accordingly, a general objective of the present invention is to offer a new and useful cleaning method of a substrate processor, solving the problems described above.

A specific objective of the present invention is to offer a cleaning method that reduces damage to the members in the substrate processing container due to the F radicals used in the conventional method, such damage being reduced by using $F_2$ as the main reaction species for cleaning, where the $F_2$ is made by recombination of F radicals.

The objectives are achieved by the following method.

The method of cleaning a substrate processing container of a substrate processor that processes a substrate according to a feature of the present invention includes:

a gas introduction step of introducing $NF_3$ gas into a remote plasma generating unit of the substrate processor;

a reactive species generating step of exciting the $NF_3$ gas and generating reactive species with the remote plasma generating unit; and a reaction step of supplying the reactive species from the remote plasma generating unit to the processing container, and pressurizing the inside of the processing container at 1333 Pa or greater to recombine the reactive species and remove sediment in the substrate processing container with the recombined reactive species.

Here, the remote plasma generating unit may excite the gas by radio frequency (RF) power.

In that case, the frequency can be set between 400 kHz and 3 GHz.

The gas may contain a fluorine compound.

The gas can be chosen from the group of $CF_4$, $C_2F_6$, $C_3F_8$, and $SF_6$ and $NF_3$.

The reactive species may also contain $F_2$ molecules that are generated by F radicals being recombined.

Sediment deposited on the exposed portion inside the processing container is removed with the reactive species in the reaction step.

The sediment may contain any of metal, metal nitride, metal oxide, silicon, and silicon compounds.

The sediment can be from the group that consists of W, WN, Ta, TaN, $Ta_2O_5$, Re, Rh, Ir, $Ir_2O_3$, Si, $SiO_2$, SiN, Ti, TiN, Ru, and $RuO_2$.

The exposed portion of the member may contain quartz.

The exposed portion of the member may contain a sintered material of $Al_2O_3$.

The exposed portion of the member may contain a sintered material of AlN.

[Effects]

According to the present invention, the fluorine molecules ($F_2$) are used as the main reactive species for cleaning the substrate processor instead of the fluorine radicals (F*) that are conventionally used, $F_2$ being obtained by recombining the fluorine radicals. Then, the damage to the members that contain, e.g., quartz, in the substrate processing container due to the fluorine radicals is reduced. That is, the quartz, which cannot be conventionally used for the members in the substrate processing container, can be used. Furthermore, the contamination of the thin film to be formed due to the F* etching AlN, $Al_2O_3$, and the like is reduced, enabling obtaining a high-quality thin film.

DESCRIPTION OF THE PREFERRED EMBODIMENTS

In the following, Embodiments of the present invention are described with reference to the accompanying drawings.

Embodiment 1

Figure 1:
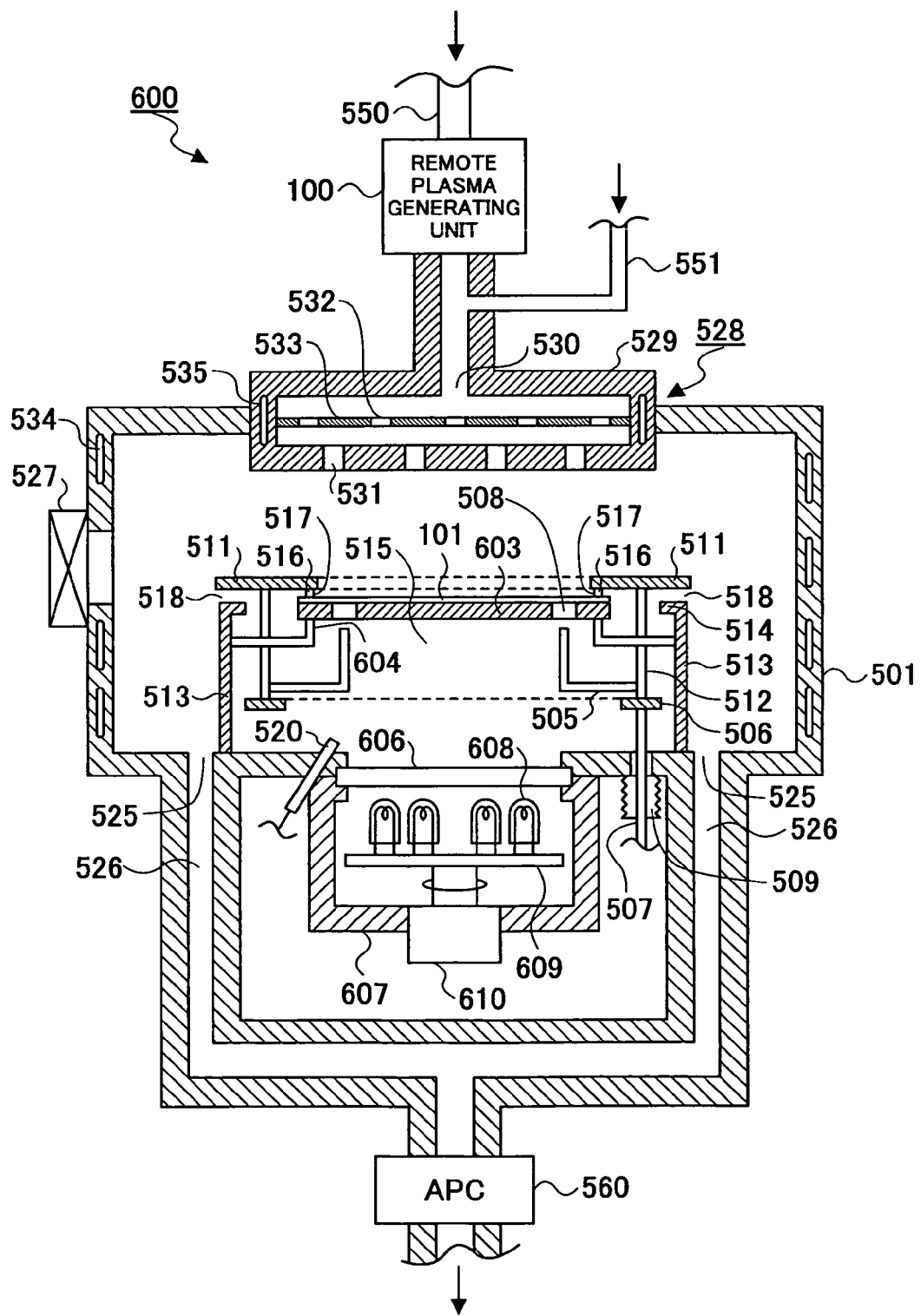
FIG. 1 is a cross-sectional view (No. 1) of a substrate processor that carries out cleaning according to an embodiment of the present invention.

FIG. 1 is a cross-sectional view showing the configuration of a substrate processor 600 that carries out cleaning according to Embodiment 1 of the present invention.

As shown in FIG. 1, the substrate processor 600 includes a processing container 501 that is made of aluminum, and the like. The processing container 501 includes a gate valve 527 that opens and closes for taking in and out a semiconductor substrate 101, the gate valve 527 being provided on the side wall of the processing container 501.

The processing container 501 includes a stand 603, on which the semiconductor substrate 101 is laid. The stand 603 is made of aluminum compounds, such as aluminum nitride, and is supported by three supporting arms 604 (two are shown in FIG. 1) that project from the wall of the upper part of a partition wall 513 of a cylinder form made from aluminum that rises from the bottom of the processing container 501.

Further, at the bottom of the processing container 501 directly under the stand 603, two or more heating lamps 608 are provided on a rotation stand 609 that also serves as a reflecting mirror. The rotation stand 609 is rotated by a motor 610 through an axle of rotation.

Further, in the upper part of a heating chamber 607 formed such that the heating lamp 608 is enclosed, a transparent window 606 made of a thermal ray transparent material, such as quartz, is arranged; the transparent window 606 separates the heating chamber 607 from the processing container 501. A thermal ray emitted from the heating lamp 608 penetrates the transparent window 606, irradiates, and heats the undersurface of the stand 603.

Below the stand 603, two or more (three in this example) L-shaped lifter pins 505 are provided (two are shown in FIG. 1), rising upward with reference to respective ring-shaped supporting members 506. The supporting members 506 are moved up and down by a rod 507 that is provided through a hole prepared in the bottom of the processing container 501, such that the lifter pins 505 are moved up and down through lifter pin holes 508 that penetrate through the stand 603. The lifter pins 505 move the semiconductor substrate 101 up and down.

The bottom end of the rod 507 is connected to an actuator that is not illustrated through bellows 509 that can be expanded and contracted in order for the processing container 501 to be kept air-tight.

Further, a clamp ring member 511 is formed at the periphery of the stand 603, the clamp ring member 511 being made from ceramics, such as aluminum nitride, approximately in the shape of a ring along the outline form of the disk-like semiconductor substrate 101. The clamp ring member 511 holds the periphery of the semiconductor substrate 101, and fixes the semiconductor substrate 101 to the stand 603.

The clamp ring member 511 is connected to the supporting member 506 through a coupling rod 512, and moves up and down in one body with the lifter pin 505. The lifter pin 505 and the coupling rod 512 are made from ceramics such as $Al_2O_3$.

A partition wall 513 is provided outside of the perimeter of the stand 603. Inside the partition wall 513, an inert gas purge chamber 515 is formed, which is purged of sediment by an inert gas supplied from a gas nozzle 520, to which an inert gas supply (not illustrated) is connected. In this manner, an unnecessary film adhesion to the side and the back of the target substrate 101, the back of the stand 603, the transparent window 606, and so on is prevented from occurring.

The upper part of the partition wall 513 is bent to be horizontal, for example, in the shape of an L character, and forms a bent section 514. The upper surface of the bent section 514 is essentially in the same plane as the upper surface of the stand 603, and the coupling rod 512 is inserted in a gap between the perimeter of the stand 603 and the bent section 514.

Further, two or more contact projections 516 are provided on the undersurface of the inner side of the clamp ring member 511 along the circumferential direction at approximately equal intervals. When the semiconductor substrate 101 is clamped, the bottom surface of the contact projection 516 makes contact with and pushes against the upper surface of the periphery section of the semiconductor substrate 101.

Further, a first gas purging gap 517 is formed between the contact projections 516, and a second gas purging gap 518 is formed between the clamp ring member 511 and the bent section 514. The inert gas in the inert gas purge chamber 515 flows into the processing container 501 through the first and second gas purging gaps 517 and 518.

Further, two or more exhaust openings 525 are formed at the bottom periphery of the processing container 501, the openings 525 being open to free passages to exhaust paths 526. The exhaust paths 526 are connected to a vacuum pump that is not illustrated through a valve APC 560, conductance of the opening of the valve APC 650 being variable. The processing container 501 is evacuated through the exhaust paths 526, and the pressure inside of the processing container 501 is adjustable by changing the opening of the APC 560.

Further, a showerhead section 528 is formed in the ceiling section of the processing container 501 that counters the stand 603, the showerhead section supplying material gas for membrane formation, cleaning gas, etc., into the processing container 501. The showerhead section 528 includes a head main part 529 made of aluminum, and the like, in the shape of a circular box, and a gas introduction mouth 530 is formed in the upper part of the head main part 529. Sources of gases, such as $WF_6$, $SiH_4$, $H_2$, etc., for membrane formation of a W film, are connected to the gas introduction mouth 530 through a membrane formation gas path 551, wherein the flow rate is controlled.

A large number of gas injection holes 531 are arranged on the bottom of the lower part of the head main part 529 for emitting the gas supplied to the head main part 529 into the processing space of the processing container 501 such that the gas is evenly provided to the surface of the semiconductor substrate 101. A diffusion board 533 having a large number of gas distributing holes 532 may be provided, as required, in the head main part 529 such that the gas can be further uniformly supplied to the semiconductor substrate 101. Further, cartridge heaters 534 and 535 are provided on the side wall of the processing container 501 and the side wall of the showerhead section 528, respectively. The cartridge heaters 534 and 535 are for adjusting the temperature of a portion that contacts membrane formation material gas to a predetermined temperature.

The membrane formation process of forming a W film on the semiconductor substrate 101 is performed in the following way, using the substrate processor 600.

First, the gate valve 527 is opened, the semiconductor substrate 101 is carried into the processing container 501 by a conveyance arm that is not illustrated, and the semiconductor substrate 101 is delivered to the lifter pins 505 by pushing up the lifter pins 505.

Next, the lifter pins 505 are lowered by lowering the rod 507 such that the semiconductor substrate 101 is laid on the stand 603. Then, the rod 507 is further lowered such that the periphery of the semiconductor substrate 101 is pressed down and fixed by the clamp ring members 511 that descend due to their own weights. Here, the stand 603 is beforehand heated to a predetermined temperature by the heating lamps 608 such that the temperature of the semiconductor substrate 101 promptly rises to a predetermined process temperature.

Next, the material gases, such as $WF_6$, $SiH_4$, and $H_2$, required for membrane formation are introduced from the showerhead section 528, and the W film is formed on the semiconductor substrate 101 laid on the stand 603.

When the W film is formed on the semiconductor substrate 101 in the substrate processing container 600, a W film also accumulates on portions other than the semiconductor substrate 101. For example, a W film is formed on the clamp ring members 511 in approximately the same thickness as on the semiconductor substrate 101. Then, a cleaning process of the present invention is performed in order to remove the W film deposited on untargeted items such as the clamp ring members 511 in the processing container 501.

Cleaning by the present invention is performed using a remote plasma generating unit 100 that is provided on the showerhead section 528. A cleaning gas path 550 is connected to the remote plasma generating unit 100.

Figure 2:
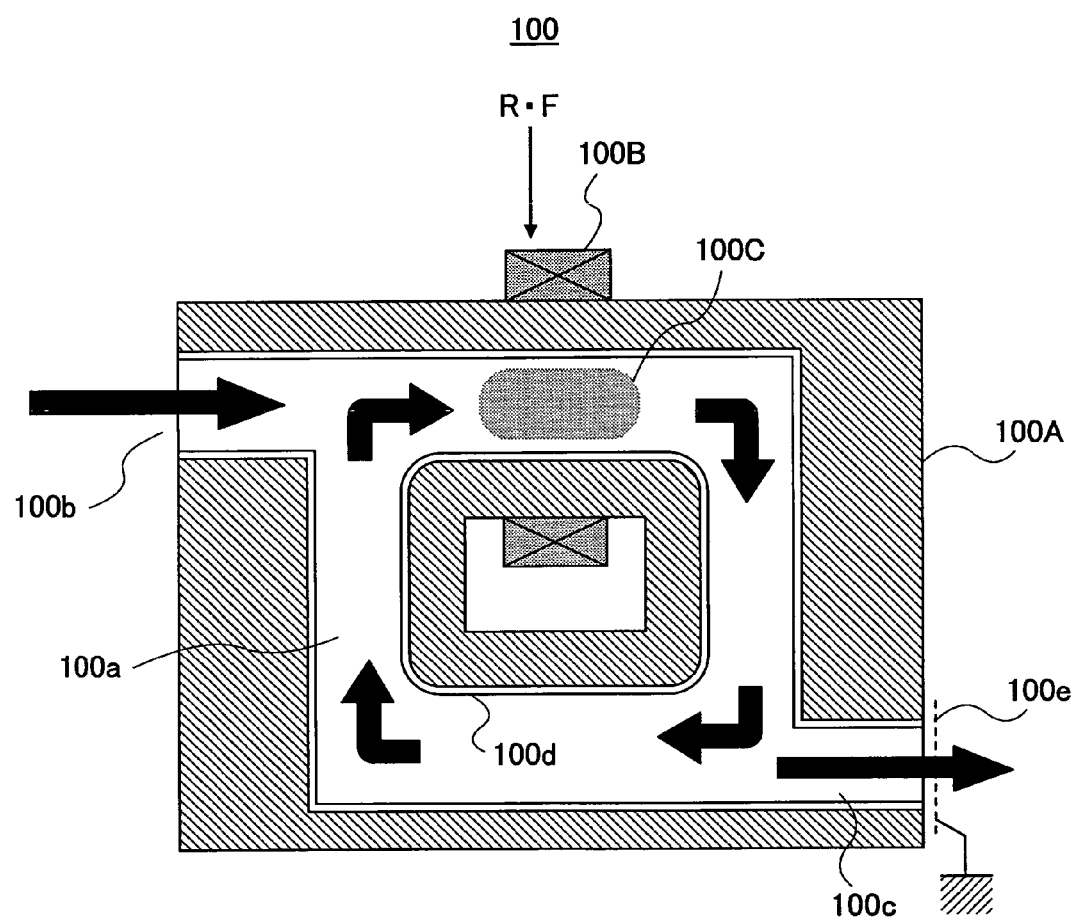
FIG. 2 is a cross-sectional view showing the outline of a remote plasma generation source.

The structure of the remote plasma generating unit 100 is shown in FIG. 2.

FIG. 2 shows the configuration of the remote plasma generating unit 100 used in the substrate processor 600 of FIG. 1.

With reference to FIG. 2, the remote plasma generating unit 100 includes a block 100A that has a gas circulation path 100a, a gas entrance 100b, and a gas outlet 100c that are connected to the gas circulation path 100a. The block A is typically made of aluminum. Further, a ferrite-core 100B is formed at a part of the block 100A.

Fluororesin coating 100d is provided to the inside of the gas circulation path 100a, the gas entrance 100b, and the gas outlet 100c. A coil is wound around the ferrite-core 100B. When RF power, the frequency of which is, e.g., 400 kHz, is supplied to the coil, plasma 100C is generated in the gas circulation path 100a.

The plasma generating method is not limited to the RF power of the frequency described above, but rather the present invention can use a remote plasma generation source that performs plasma excitation in a range between 400 kHz RF and 3 GHz microwave.

As the cleaning gas, for example, $NF_3$ is supplied from the gas entrance 100b; then as the plasma 100C is excited, fluorine radicals F* and fluorine ions are formed in the gas circulation path 100a. The fluorine radicals and fluorine ions are reactive species that may mainly contribute to cleaning.

Here, the fluorine ions disappear as they circulate through the circulation path 100a, and the fluorine radicals F* are mainly output from the gas outlet 100c. Further, with the configuration of FIG. 2, by arranging an ion filter 100e that is grounded at the gas outlet 100c, charged particles including the fluorine ions are removed such that only fluorine radicals are supplied to the processing container 501. Further, even if the ion filter 100e is not grounded, since the structure of the ion filter 100e acts as a diffusion board, charged particles including the fluorine ions can be sufficiently removed.

In this way, the remote plasma generating unit 100 generates and supplies the reactive species to the substrate processing container 501 through the showerhead section 528, the reactive species that contribute to cleaning mainly consisting of fluorine radicals.

Next, a cleaning method of cleaning sediment deposited in the substrate processing container 501 of the substrate processor 600 is explained.

If a process of forming a 100 nm thick W film on the semiconductor substrate 101 by the substrate processing container 600 is repeated 25 times, a W film having about a 2.5 μm thickness is formed on the clamp ring 511. Then, according to Embodiment 1, the following cleaning process is performed so that the W film deposited in the substrate processing container 501 is removed.

First, Ar at 1000 sccm and $NF_3$ at 10 sccm are supplied into the remote plasma generating unit 100 from the cleaning gas introduction section 550. The Ar and $NF_3$ are supplied to the processing container 501 through the showerhead section 528 from the remote plasma generating unit 100. When the Ar and $NF_3$ that are supplied are exhausted from the exhaust openings 525 through the exhaust paths 526, the pressure in the processing container 501 is adjusted to 600 Pa (4.5 Torr) by the APC 560, and plasma is excited in the remote plasma generating unit 100.

Then, the flow rates of the gases are increased to, for example, Ar gas 3000 at sccm and $NF_3$ gas at 210 sccm, the pressure in the processing container 501 is also adjusted to 5.33 kPa (40 Torr) by the APC 560, etching of the W film deposited inside the processing container 501 is started, and the cleaning process starts.

According to Embodiment 1, the 2.5 μm thick W film deposited on the clamp ring member 511 in the processing container 501 was completely removed by performing the cleaning process for 5 minutes.

Further, according to the present invention, since the pressure in the processing container 501 is adjusted to be high at 5.33 kPa (40 Torr) by the APC 560 as compared with the conventional method, the F radicals generated by the remote plasma generating unit 100 tend to frequently collide with each other, and are recombined resulting in $F_2$. Namely, the reactive species contributing to cleaning is mainly $F_2$.

In other words, $F_2$ molecules, which are obtained by F radicals being recombined, dominantly serve as the reactive species of cleaning, and mainly contribute to etching of the W film.

Conventionally, it is difficult to use quartz for members arranged in the processing container 501, because F radicals are abundantly used, and the F radicals etch the quartz. However, since $F_2$ molecules, the etching rate of which concerning the quartz is low, are used according to Embodiment 1, the quartz can be used for the members.

For example, nearby the transparent window 606, the purging is performed by the inert gas supplied from the gas nozzle 520 as described above; however, it is difficult to sufficiently discharge F radicals from the periphery of the transparent window 606. For this reason, the transparent window 606 made of quartz tends to be etched, and to become damaged.

According to Embodiment 1, since $F_2$ is mainly used as the reactive species for cleaning as described above, the damage to the quartz member is reduced, and it becomes possible to install the transparent window 606 that consists of a quartz member in the processing container 501.

Further, if a monitoring window is desired for observing inside of the substrate processing container 501, the present invention enables the monitoring window to be made of quartz. By the conventional cleaning method, since it is difficult to use a quartz member, an expensive material such as sapphire has to be used, which raises costs.

Further, if the conventional cleaning method is applied to members made of ceramics sintered at atmospheric pressure, such as the clamp ring member 511 and the stand 603 made of sintered AlN, and the lifter pin 505 and the coupling rod 512 made of sintered $Al_2O_3$, although the etching amount by F radicals is small as compared with the quartz, they are certainly etched. Then, the etched ceramics remain in the processing container 501, becoming particles and contaminants that degrade the quality of the thin film to be formed in the processing container 501.

Conversely, if cleaning according to Embodiment 1 using mostly $F_2$ is performed, the sintered AlN and $Al_2O_3$ are not etched, and leave no metal contaminants in the substrate processing container 501. Further, the ceramics of the member are not limited to AlN and $Al_2O_3$, but the same effect is obtained with other ceramic materials.

Further, the film formed in the substrate processor, i.e., the film of cleaning target according to the present invention, is not limited to the W film, but the effect of Embodiment 1 is also obtained with films made of other materials such as WN, Ta, TaN, $Ta_2O_5$, Re, Rh, Ir, $Ir_2O_{3, Si, SiO2}$, SiN, Ti, TiN, Ru, and $RuO_2$.

Embodiment 2

Figure 3:
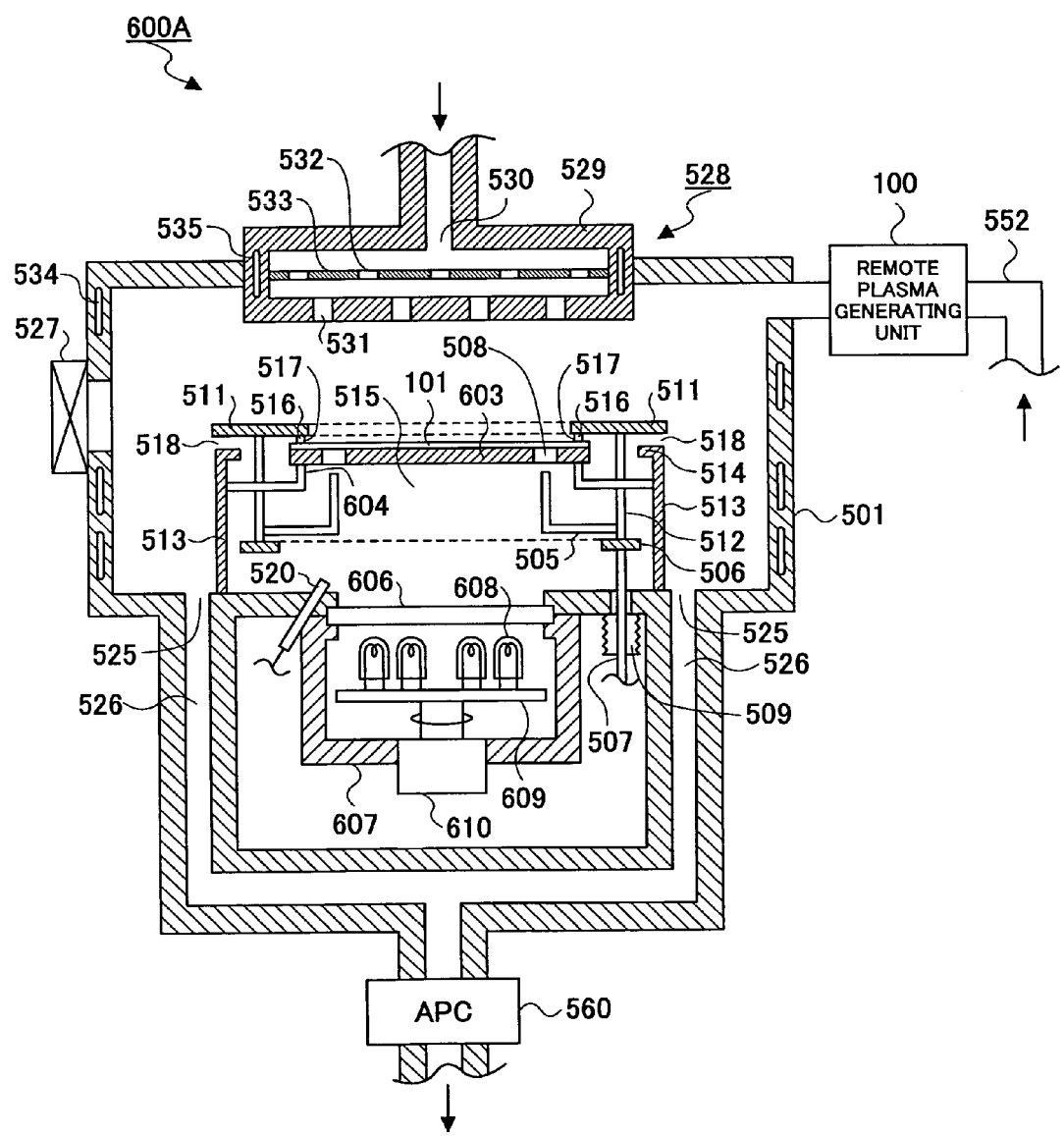
FIG. 3 is a cross-sectional view (No. 2) of the substrate processor that carries out cleaning according to the embodiment of the present invention.

The substrate processor 600 can be modified into a substrate processor 600A shown in FIG. 3.

FIG. 3 shows the substrate processor 600A that is a modification example of the substrate processor 600 shown in FIG. 1. Here, the same reference numbers are given to the same items as described above, and explanation thereof is not repeated.

With reference to FIG. 3, the substrate processor 600A includes a cleaning gas introduction path 552 that provides a passage to the processing container 501 on a side of the processing container 501, and the remote plasma generating unit 100 is installed in the cleaning gas introduction path 552.

According to Embodiment 2, it is possible to form a W film on the semiconductor substrate 101 by $WF_6$, $H_2$, and $SiH_4$ that are supplied from the membrane formation gas sources (not illustrated) connected to the showerhead section 528 as Embodiment 1.

Further, according to Embodiment 2, it is possible to perform cleaning by $NF_3$ and Ar supplied from the gas sources (not illustrated) connected to the cleaning gas introduction path 552 by the same method as Embodiment 1.

Damage to the transparent window 606 made of quartz can be reduced according to Embodiment 2 as in Embodiment 1.

Further, damage due to etching of the clamp ring member 511 and the stand 603 that consist of AlN, and the lifter pin 505 and the coupling rod 512 that consist of $Al_2O_3$ are reduced, and the amount of aluminum compound contamination in the processing container 501 is reduced.

Embodiment 3

Figure 4:
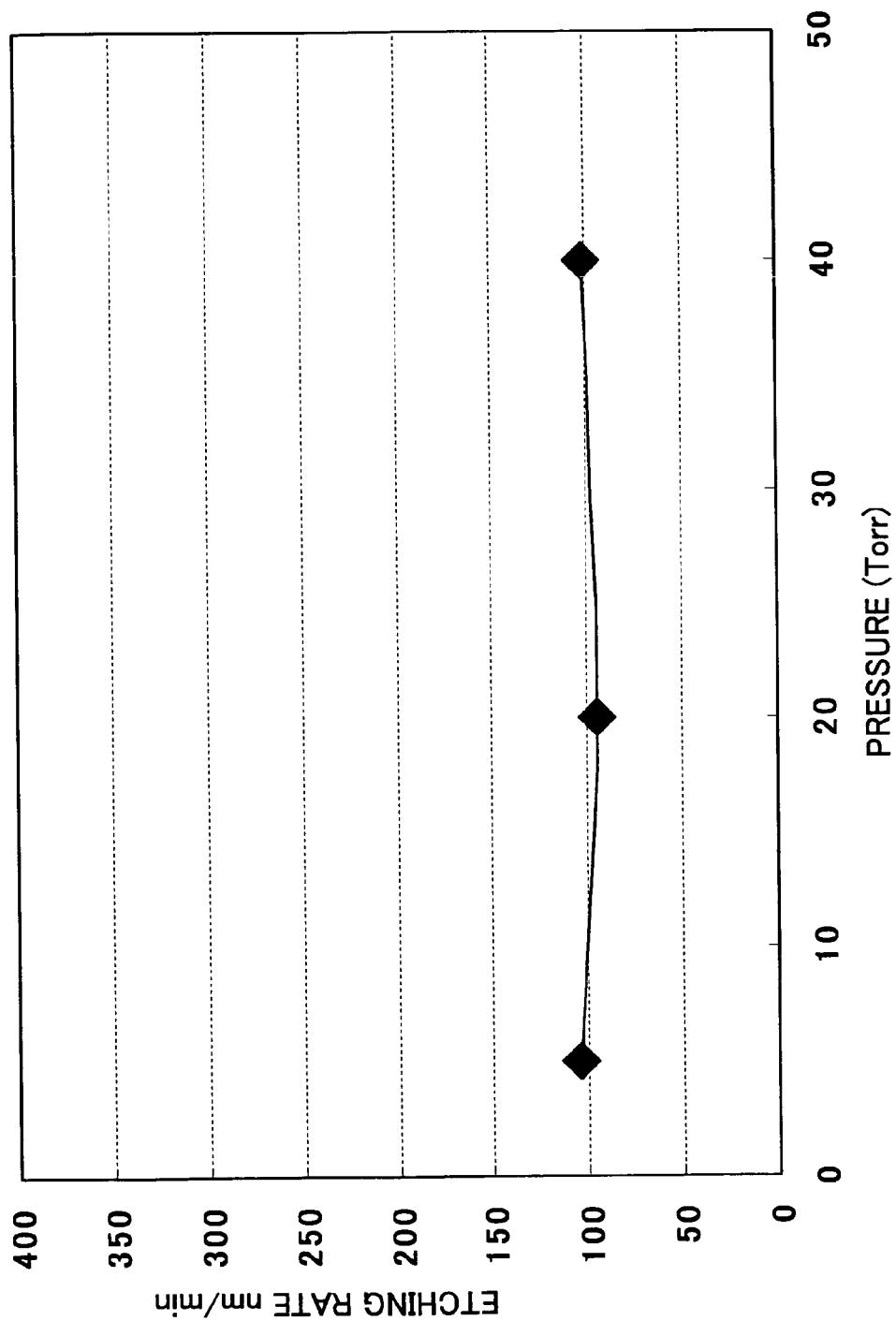
FIG. 4 is a graph (No. 1) showing cleaning speed according to the embodiment of the present invention.
Figure 5:
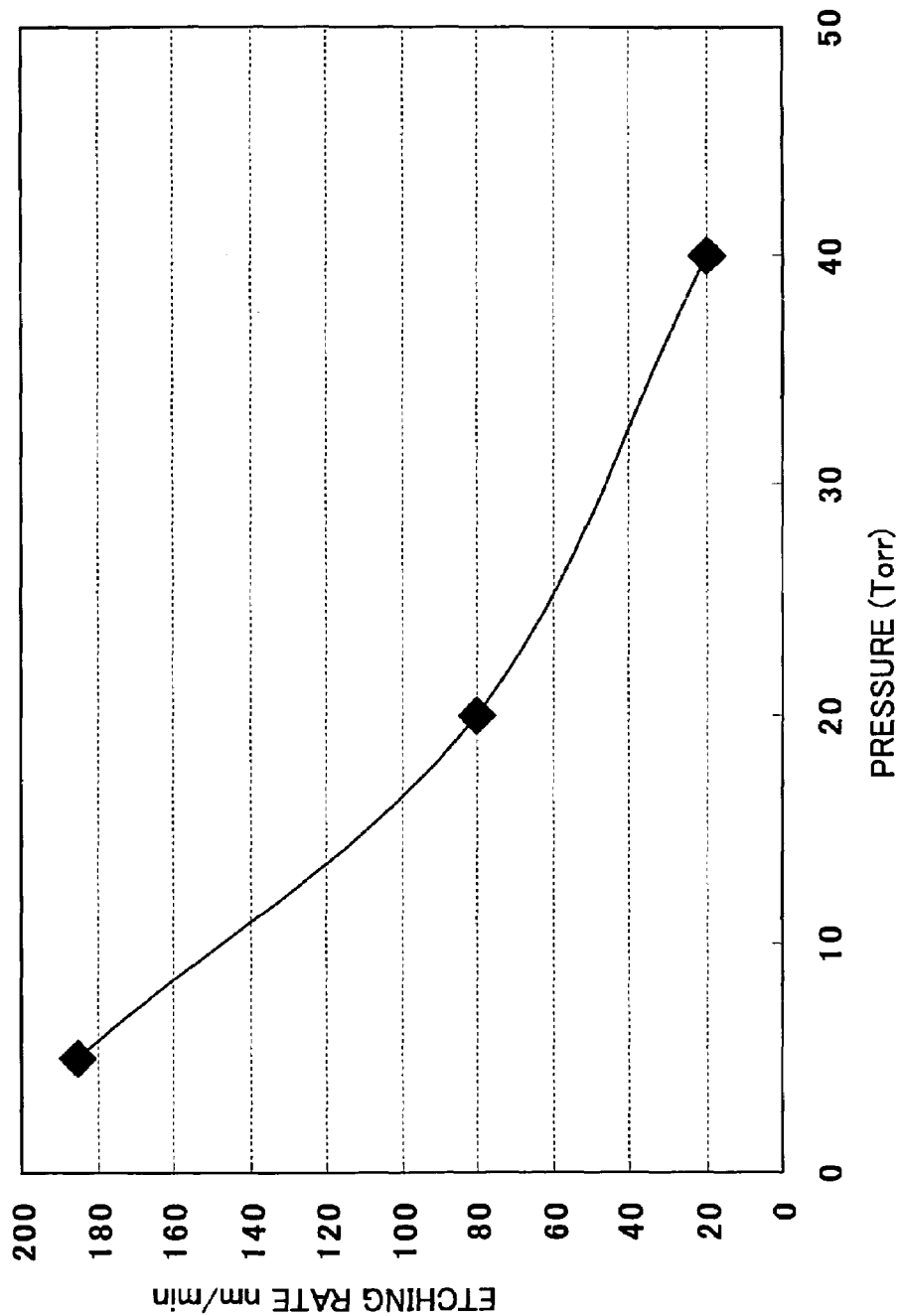
FIG. 5 is a graph (No. 2) showing the cleaning speed according to the embodiment of the present invention.

Next, measurement results concerning the speed of cleaning by the substrate processor 600 are explained as Embodiment 3 with reference to FIG. 4 and FIG. 5.

FIG. 4 and FIG. 5 are graphs showing etching speeds (etching rates) obtained as follows. A wafer, on which a thin film is formed, is laid on the stand 603 of the substrate processor 600. The cleaning process is carried out. The thin film thickness that is etched is measured, and the etching speed for cleaning the thin film is obtained.

FIG. 4 shows the etching rate of a W film formed on the wafer, and FIG. 5 shows the etching rate of a thermal oxidation film ($SiO_2$) formed on the wafer, wherein etching rates are plotted for varied pressure values (the horizontal axis). These graphs show changes in the etching rates corresponding to changes in the pressure of the substrate processing container 501. Here, the flow rate of $NF_3$ is set at 230 sccm, and Ar flow rate is set at 3000 sccm.

As described above with reference to Embodiment 1, the quantity of F radicals (F*), which are the reactive species contributing to cleaning, supplied from the remote plasma generating unit 100 is decreased as the pressure increases, and $F_2$ becomes dominant where the pressure is greater than about 1333 Pa (10 Torr).

With reference to FIG. 4, the etching rate of the W film hardly changes, even if the pressure rises. This indicates that even if the reactive species change from F* to $F_2$, the W film is etched by $F_2$ to the same degree as F*, and the cleaning speed is maintained independent of the pressure.

With reference to FIG. 5, the etching rate of the thermal oxidation film rapidly decreases where the pressure is greater than 1333 Pa (10 Torr). This indicates that the recombination of F radicals generates $F_2$ as the pressure is increased as described above, and the etching rate of the thermal oxidation film by $F_2$ is low.

Figure 6:
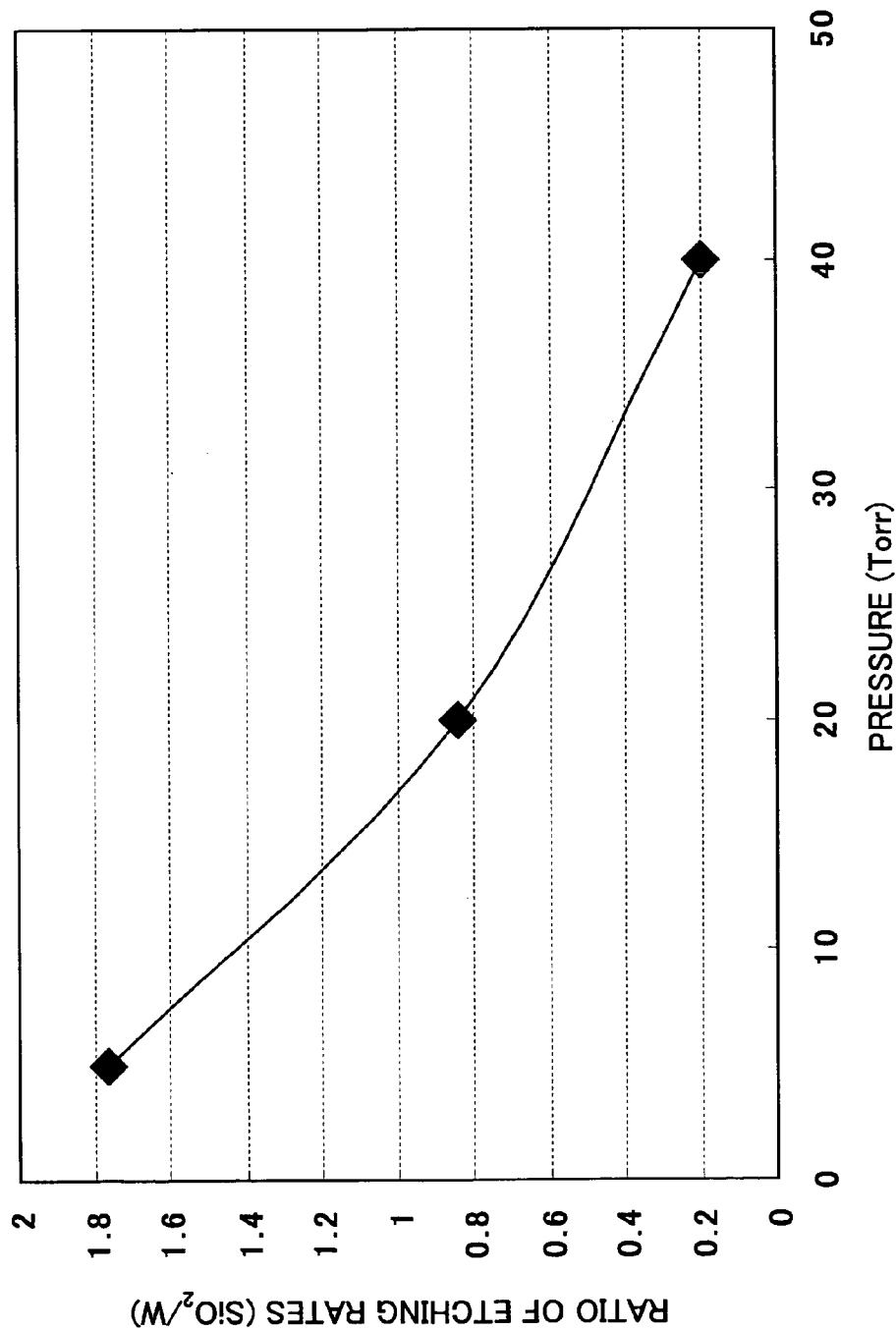
FIG. 6 is a graph showing a ratio of the cleaning speeds according to the embodiment of the present invention.

FIG. 6 is a graph that expresses the ratio of the etching rate of the thermal oxidation film to the etching rate of the W film.

With reference to FIG. 6, it turns out that the ratio of the etching rate of the thermal oxidation film to the etching rate of the W film decreases as the pressure of the substrate processing container 501 is raised.

In the cleaning process of the Embodiments, the substrate processing container is pressurized at greater than about 1333 Pa (10 Torr) such that the etching rate of $SiO_2$ is reduced. Accordingly, a quartz member formed by $SiO_2$ can be used in the substrate processing container 501.

Embodiment 4

Next, as Embodiment 4, measurement results concerning aluminum residue in the substrate processing container 501 after the cleaning process of Embodiment 1 are shown in Table 1.

TABLE 1

| | TOP SURFACE | BACK SURFACE |
|---|---|---|
| BEFORE CLEANING | $1.1 \times 10^{11}$ | $1.5 \times 10^{11}$ |
| AFTER CONVENTIONAL CLEANING AT 5 Torr | $2.0 \times 10^{13}$ | $7.0 \times 10^{13}$ |
| AFTER CLEANING BY EMBODIMENT 40 Torr | $1.1 \times 10^{11}$ | $1.6 \times 10^{11}$ |

Table 1 shows the measurement results of contamination by aluminum of the wafer (top surface and back surface) using an ICP mass analysis method, wherein the unit is atoms/ cm². The wafer, which is a Si wafer, is transported to the stand 603 of the substrate processing container 501 after the cleaning process of Embodiment 1 for 5 minutes is repeated 20 times.

For comparison purposes, Table 1 also gives measurement results after conventional cleaning at a low pressure of 667 Pa (5 Torr) of the processing container 501, and measurements before cleaning.

With reference to Table 1, before cleaning, aluminum was present on the top surface of the wafer at the rate of $1.1 \times 10^{11}$ (atoms/cm²), and the rate of the back surface was $1.5 \times 10^{11}$. The quantity of aluminum after cleaning by the conventional method (667 Pa, 5 Torr) increased to $2.0 \times 10^{13}$ on the top surface, and to $7.0 \times 10^{13}$ on the back surface. The increase was considered to be due to AlN of the stand 603 and the clamp ring member 511 being etched by F radicals at the time of cleaning, and aluminum compound remaining in the processing container 501.

In contrast, according to the cleaning method of the present invention (5.33 kPa, 40 Torr), the quantity of aluminum after cleaning was $1.1 \times 10^{11}$ for the top surface, and $1.6 \times 10^{11}$ for the back surface, i.e., the values hardly changed to the before cleaning.

This is because metal contaminant is not generated in the substrate processing container 501 according to the cleaning method of the present invention, wherein the stand 603 and the clamp ring member 511 that consist of sintered AlN, and the lifter pins 505 and the coupling rod 512 that consist of sintered $Al_2O_3$ are hardly etched since $F_2$ is used in the cleaning.

Next, Embodiment 5 of the present invention is described below with reference to FIGS. 7 through 10.

Embodiment 5

Figure 7:
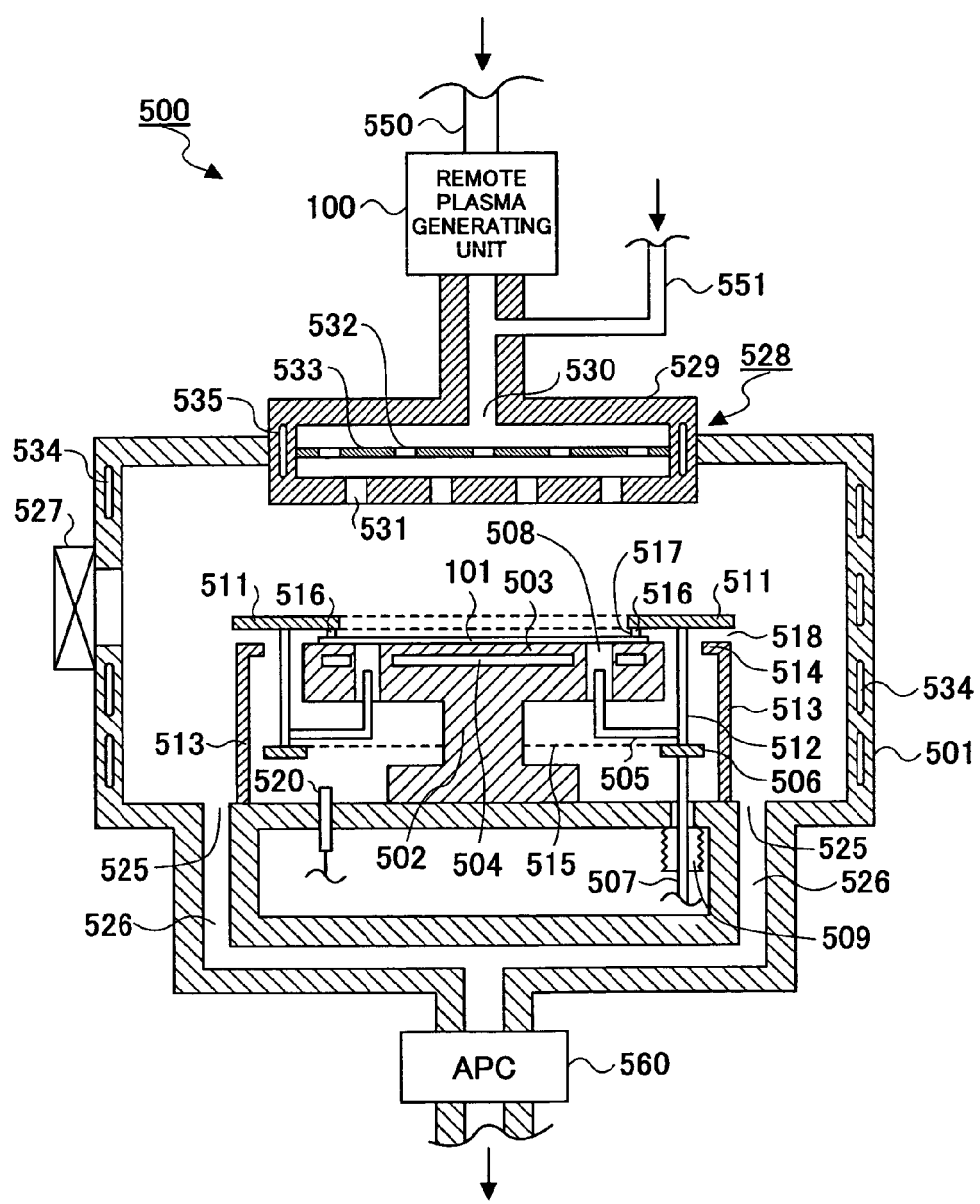
FIG. 7 is a cross-sectional view (No. 3) of the substrate processor that carries out cleaning according to the embodiment of the present invention.

FIG. 7 shows a substrate processor 500, to which the cleaning method of the present invention can apply. Here, the same reference numbers are used to the same items as described above, and explanation thereof is not repeated.

With reference to FIG. 7, a stand 503 is provided at the bottom of the processing container 501 of the substrate processor 500. The stand 503 includes a heating member such as a resistance heater 504, and is supported by a support 502. The stand 503 is made of aluminum compounds, such as aluminum nitride, and the semiconductor wafer 101 is laid on the stand 503.

The substrate processor 500 does not use a quartz member such as the transparent window 606 in the case of the substrate processor 600. However, a quartz member can be used for a window for observing inside of the substrate processing container 501, when configuring the substrate processing container 501. This reduces cost, because it is difficult to use a quartz member, and an expensive member, such as sapphire, must be used according to the conventional cleaning method.

Further, according to Embodiment 5, the stand 503 and the clamp ring member 511 that consist of sintered AlN, and the lifter pin 505 and the coupling rod 512 that consist of sintered $Al_2O_3$ are not etched, and metal contaminant is prevented from being generated in the substrate processing container 501. Further, the ceramic material is not limited to AlN and $Al_2O_3$, but other ceramic materials may be used to obtain the same effect.

Embodiment 6

Figure 8:
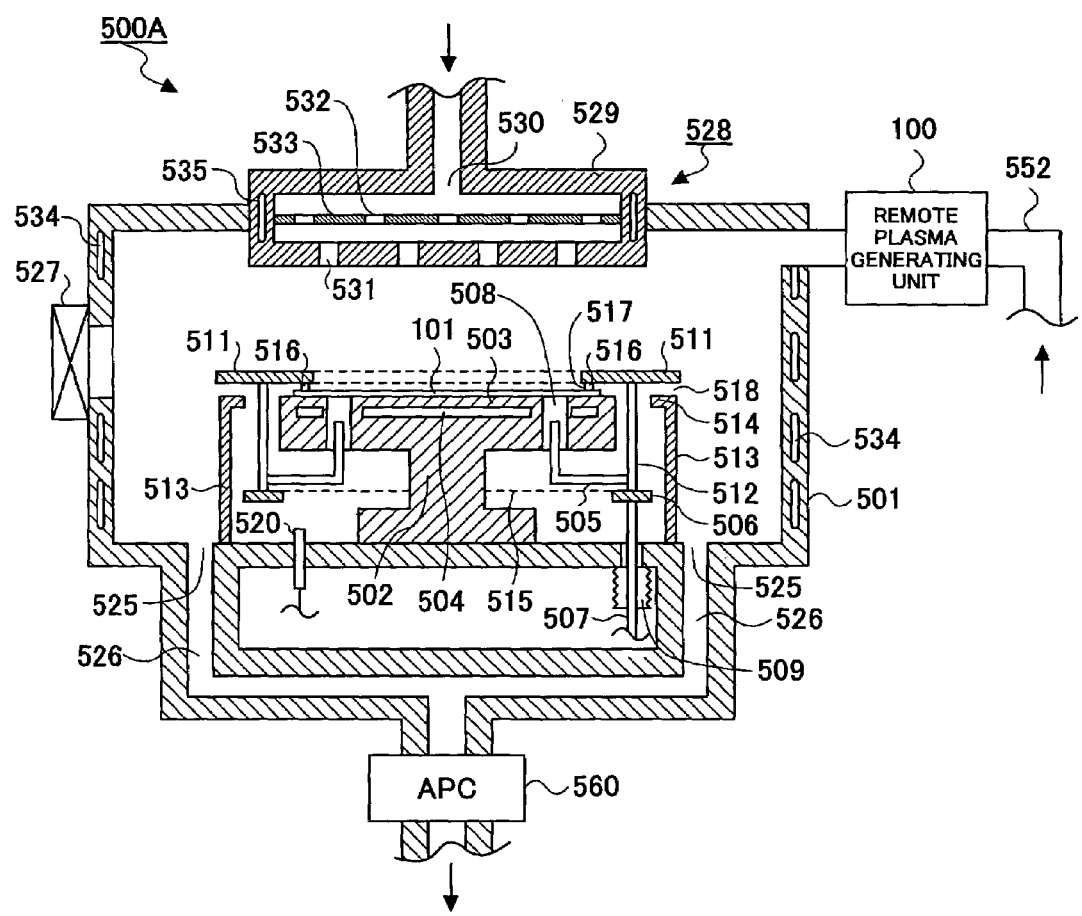
FIG. 8 is a cross-sectional view (No. 4) of the substrate processor that carries out cleaning according to the embodiment of the present invention.

Further, the substrate processor 500 can be modified like a substrate processor 500A shown in FIG. 8, which is Embodiment 6 of the present invention.

FIG. 8 shows the substrate processor 500A that is a modification example of the substrate processor 500 shown in FIG. 7. Here, the same reference numbers are used to the same items as explained previously, and explanation thereof is not repeated.

With reference to FIG. 8, the substrate processor 500A includes a cleaning gas introduction path 552 that provides free passage to the processing container 501, which is arranged on a side of the processing container 501. The remote plasma generating unit 100 is installed in the cleaning gas introduction path 552.

According to Embodiment 6, it is possible to form a W film on the semiconductor substrate 101 using $WF_6$, $H_2$, and $SiH_4$ that are supplied from the membrane formation gas sources (not illustrated) connected to the showerhead section 528.

Further, it is possible to perform cleaning by the same method as Embodiment 1 by $NF_3$ and Ar that are supplied from the gas sources (not illustrated) connected to the cleaning gas introduction path 552.

Further, according to Embodiment 6, the stand 503 and clamp ring member 511 that consist of sintered AlN, and the lifter pin 505 and the coupling rod 512 that consist of sintered $Al_2O_3$ are not etched, and metal contaminant is prevented from being generated in the substrate processing container 501.

Embodiment 7

Next, a substrate processor 300 according to Embodiment 7 of the present invention is described with reference to FIG. 9.

Figure 9:
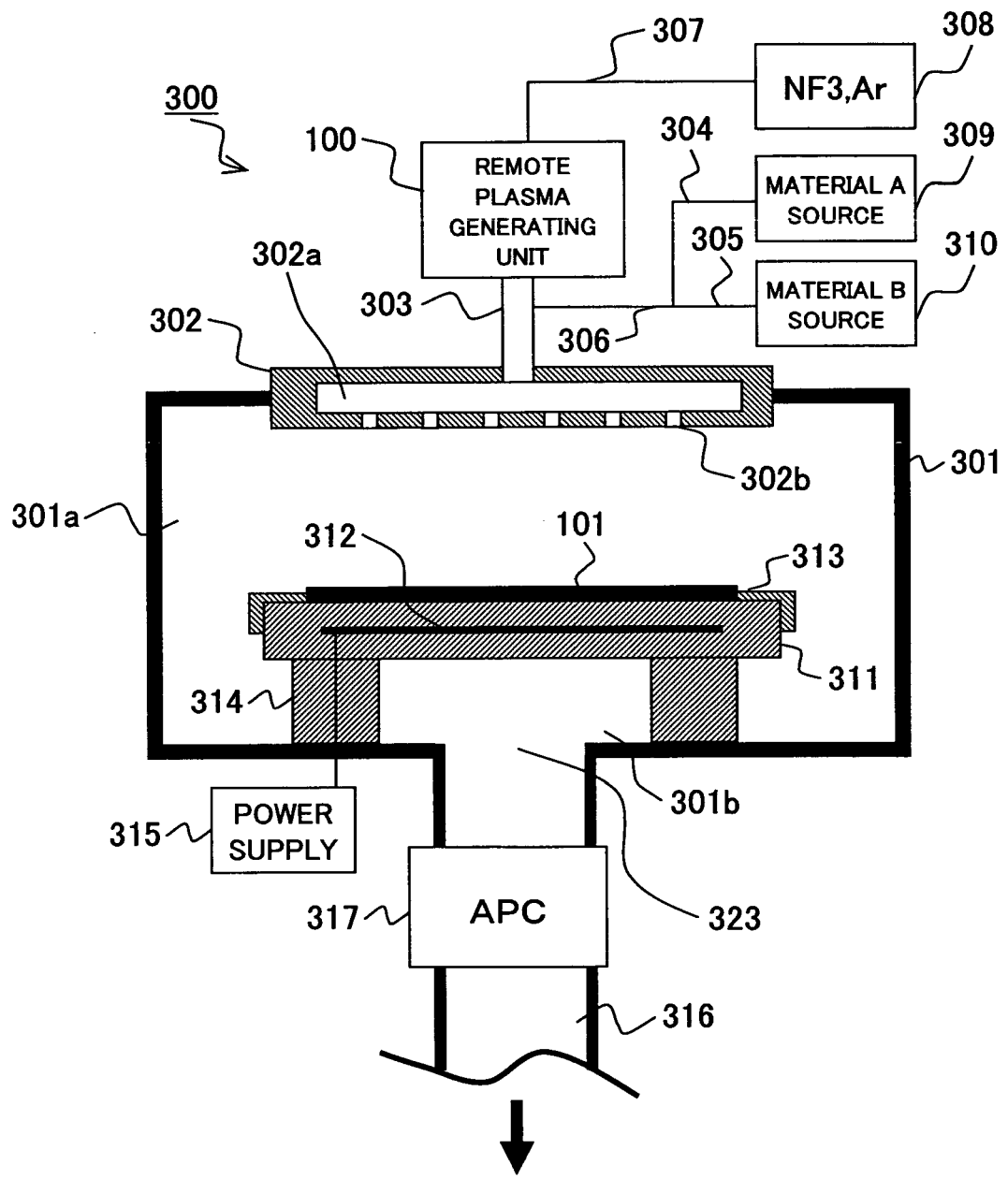
FIG. 9 is a cross-sectional view (No. 5) of the substrate processor that carries out cleaning according to the embodiment of the present invention.

As shown in FIG. 9, the substrate processor 300 includes a processing container 301. At the bottom of the processing container 301, a stand 311 made of AlN is arranged for holding the semiconductor substrate. The stand 311 is approximately in the shape of a cylinder, and is supported by two or more stand supports 314 arranged at equal intervals. A heater 312 connected to a power supply 315 is arranged in the stand 311.

Further, on the stand 311, a guide ring 313 made of sintered AlN is arranged at the periphery of the stand 311 for holding the semiconductor substrate 101.

Further, a showerhead section 302 to which a gas introduction section 303 is connected is arranged at the upper part of the processing container 301, the internal space of the showerhead section being labeled 302a. The remote plasma generating unit 100 to which a cleaning gas source of supply 308 is connected through the cleaning gas introduction path 307 is arranged at the upper part of the gas introduction section 303. A membrane formation gas introduction path 306 connected to the gas introduction section 303 is provided.

The membrane formation gas introduction path 306 is connected to a material gas A introduction path 304 and a material gas B introduction path 305, which are connected to a material A source 309 and a material B source 310, respectively.

When forming a membrane on the semiconductor substrate 101, the material gas A and material gas B are supplied to the showerhead section 302 from the material A source 309 and the material B source 310, respectively. Then, the gases are spread and sufficiently mixed in the internal space 302a of the showerhead 302, and are supplied to a processing space 301a formed in the processing container 301 through gas supply holes 302b. Then, the desired thin film is formed on the semiconductor substrate 101.

When cleaning, carrier gas, such as $NF_3$ or a mixture of $NF_3$ and Ar, is supplied from the cleaning gas source of supply 308 to the remote plasma generation source 100. The remote plasma generation source 100 generates reactive species by plasma-exciting the gas, and the reactive species required for cleaning is supplied to the processing space 301a through the gas supply holes 302b of the showerhead section 302.

The processing space 301a is evacuated by a vacuum pump that is not illustrated through an exhaust opening 323 arranged at the bottom of the processing container 301 through an exhaust path 316. An APC 317 arranged in the exhaust path 316 is capable of adjusting the pressure of the processing space 301a to a desired pressure.

According to Embodiment 7, cleaning of the processing container 301 can be performed by the same method as Embodiment 1 at pressures greater than 1333 Pa (10 Torr) as disclosed by the present invention, for example, 53.3 kPa (40 Torr), for example, using $NF_3$ and Ar.

Further, according to Embodiment 7, uniform cleaning can be performed by the processing container 301 without residue remaining in a specific part after cleaning, since the exhaust opening 323 of the processing container 301 is arranged at the center of the processing container 301, and the gas introduced into processing space 301a is equally exhausted centering on the stand 311.

Further, it is possible to reduce the damage to the members made of such as quartz, AlN, and $Al_2O_3$ in the processing container of the substrate processor according to the cleaning method of the present invention as described above.

Embodiment 8

Next, a substrate processor 300A according to Embodiment 8 of the present invention is described with reference to FIG. 10. Here, the same reference numbers are used for the items already described, and explanation thereof is not repeated.

Figure 10:
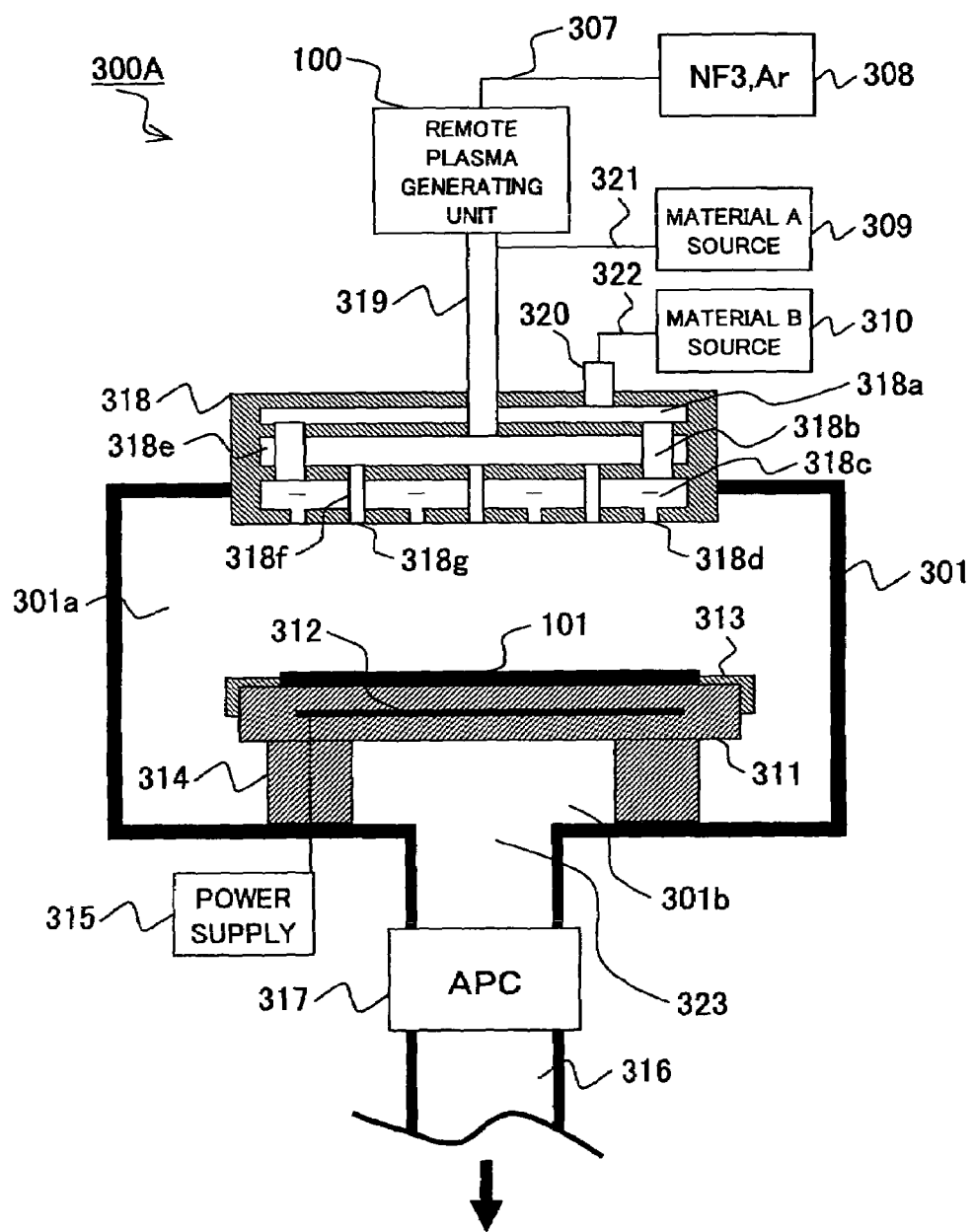
FIG. 10 is a cross-sectional view (No. 6) of the substrate processor that carries out cleaning according to the embodiment of the present invention.

With reference to FIG. 10, the showerhead section 318 at the upper part of the processing container 301 has a gas introduction section A 319 and a gas introduction section B 320. On the gas introduction section A 319, the remote plasma generation source 100, to which the cleaning gas source 308 is connected, is arranged.

The gas introduction section A 319 is connected to the material A source 309 through a material gas A supply path 321, and the gas introduction section B 320 is connected to the material B source 310 through a material gas B supply path 322.

After sufficiently diffusing the material gas A supplied from the material A source 309 in a material gas A diffusion chamber 318e formed in the showerhead section 318, the gas is then supplied to the processing space 301a from two or more gas feed holes 318g that provide free passage from the material gas A diffusion chamber 318e to the processing space 301a through a material gas A transportation path 318f.

After sufficiently diffusing the material gas B supplied from the material B source 310 through a material gas B introduction path 318a in a material gas B diffusion chamber 318c formed in the showerhead section 318, the gas is then supplied to the processing space 301a from two or more gas feed holes 318d that provide free passage from the material gas B diffusion chamber 318c to the processing space 301a through a material gas B transportation path 318b.

As described above, according to the substrate processor 300A of Embodiment 8, gas introduction of the so-called postmix method is used, wherein the material gas A and the material gas B are not mixed in the showerhead section 318, but are mixed in the processing space 301a, and a desired membrane formation process can be performed with the gas mixture by the postmix method using the material gas A and the material gas B.

According to Embodiment 8, cleaning of the processing container 301 can be performed by the same method as Embodiment 1, for example, using $NF_3$ and Ar at pressure greater than 1333 Pa (10 Torr), for example, 53.3 kPa (40 Torr).

Embodiment 8 is also capable of reducing damage to the members made of such as quartz, AlN and $Al_2O_3$ in the processing container 301 of the substrate processor 300A by the cleaning method of the present invention.

Embodiment 9

Figure 11:
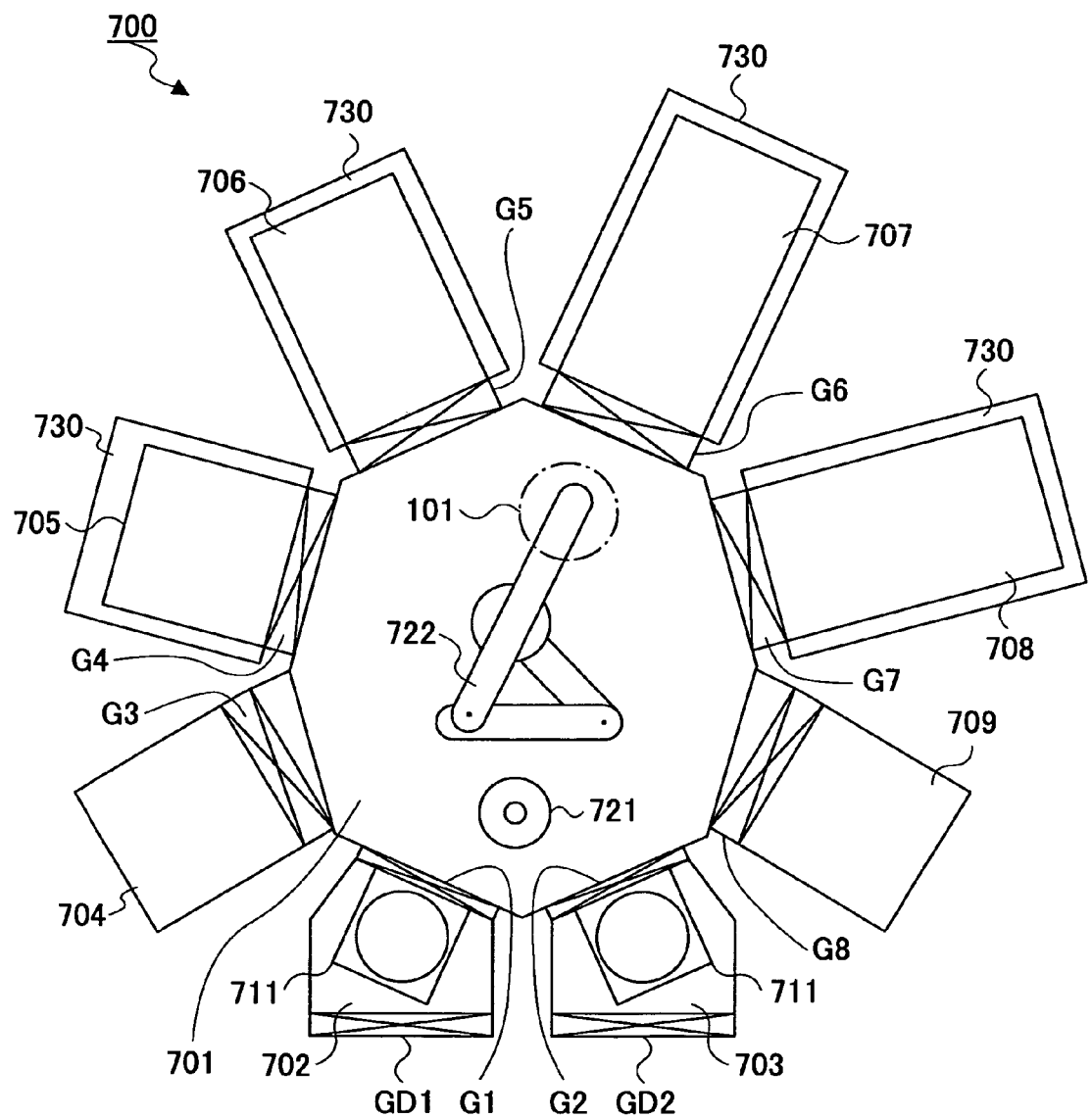
FIG. 11 is a cross-sectional view of a cluster tool apparatus that carries out cleaning according to the embodiment of the present invention.

The substrate processors 600, 600A, 500, 500A, 300, and 300A described above can constitute a cluster tool apparatus 700 as shown in FIG. 11, whereby consecutive processing is available.

The cluster tool apparatus 700 shown in FIG. 11 includes a common conveyance chamber 701 that conveys the semiconductor substrate 101, and the like. The common conveyance chamber 701 is made of, e.g., aluminum, in the shape of, e.g., an octagon, and is arranged at the center of the cluster tool apparatus 700. Around the common conveyance chamber 701, a first cassette chamber 702, a second cassette chamber 703, a moisture removal processing chamber 704, first through fourth substrate processing chambers 705 through 708, respectively, and a cooling chamber 709 are arranged through gate valves G1 through G8, respectively, the gate valves being capable of opening and closing.

The moisture removal chamber 704 is for heating and removing moisture of the semiconductor substrate as required. The cooling chamber 709 is for cooling, as required, the semiconductor substrate to a temperature that can be handled.

Each of the first and the second cassette chambers 702 and 703 is for accommodating a cassette that contains, e.g., 25 substrates.

Gate doors GD1 and GD2 are arranged on the side walls of the cassette chambers 702 and 703, respectively, the gate doors being for taking in and out the cassette by opening and closing. A cassette stand that is not illustrated ascends to and descends from the gate doors. Further, as for the cassette chambers 702 and 703, inert gas, for example, N2 gas is supplied, and a vacuum environment is made possible.

The common conveyance chamber 701 includes a rotation positioning mechanism 721 for positioning the substrate taken in, and a conveyance arm 722 consisting of a multi-joint arm mechanism that can expand, contract, and rotate while holding the substrate. By expanding, contracting, and rotating the multi-joint arm mechanism, the substrate is taken in to and out from each processing chamber. Further, creating a vacuum environment and supplying inert gas, for example, N2 gas, to the common conveyance chamber 701 are possible.

Further, airtight boxes 730 are arranged such that each of the processing chambers 705 through 708 is hermetically sealed. In this way, the processing gas does not leak. Each airtight box 730 has an exhaust duct (not illustrated) such that the inside of the airtight box 730 is evacuated.

To one of the processing chambers 705 through 708, one of the substrate processors 600, 600A, 500, 500A, 300, and 300A is applied. If such substrate processor is applied to the third processing chamber 707, for example, the other processing chambers, namely, the first, second and the fourth processing chambers 705, 706, and 708, respectively, are to carry out a pretreatment and after-treatment, as applicable and as required, of the membrane formation process performed by the third processing chamber 707. In addition, the process is not limited to what is described above. Further, the substrate processors 600, 600A, 500, 500A, 300, and 300A can be applied to any one of the first through fourth substrate processing chambers as desired. Further, the combination of pretreatment and after-treatment can also be modified as desired.

Next, an example of an operational flow of the cluster tool apparatus 700 is explained.

First, the semiconductor substrate 101 that is the target of the process is accommodated in the cassette 711, and is taken into, for example, the first cassette chamber 702 through the gate door GD1. Then, the first cassette chamber 702 is sealed and evacuated. Then, the gate valve G1 is opened, and the conveyance arm 722 in the common conveyance chamber 701, which is beforehand evacuated, is extended such that the target semiconductor substrate 101 is taken out. The semiconductor substrate 101 is positioned by the rotation positioning mechanism 721. Then, the conveyance arm 722 transports the semiconductor substrate 101 that is properly positioned to the moisture removal chamber 704 through the gate valve G3 that is opened such that the semiconductor substrate 101 is heated, and moisture adhering to the semiconductor substrate 101 is evaporated and removed. Here, the moisture removal process is performed if needed; and when unnecessary, this process may be skipped, and the following process is performed.

Next, the semiconductor substrate 101 is conveyed to the third substrate processing chamber 707 through the gate valve G6, and a desired membrane formation process is carried out by the third substrate processing chamber 707. As described above, it is possible to apply any one of the substrate processors 600, 600A, 500, 500A, 300, and 300A to the third processing chamber 707, and a desired membrane formation process is performed by the third processing chamber 707.

Next, the semiconductor substrate 101 is taken out by the conveyance arm 722 through the gate valve G6, which is open. Then, the semiconductor substrate 101 is taken into the cooling processing chamber 709 through the gate valve G8, which is open. Here, the semiconductor substrate 101 is cooled to a predetermined handling temperature. The finished and cooled semiconductor substrate 101 is accommodated in the cassette 711 in the second cassette chamber 703 through the gate valve G2.

Further, as described above, a pretreatment prior to the membrane formation process by the third processing chamber 707 may be performed by any one of the first processing chamber 705, the second processing chamber 706 and the fourth processing chamber 708. Similarly, after-treatment of the membrane formation process by the third processing chamber 707 may be performed by any one of the first processing chamber 705, the second processing chamber 706 and the fourth processing chamber 708.

In this manner, it is possible to consecutively process target semiconductor substrates one by one with the cluster tool apparatus 700.

Further, as for cleaning according to the present invention performed by the third processing chamber 707, a practice may be to clean every 25 membrane formation processes performed by the third processing chamber 707, that is, cleaning may be performed after every 25 semiconductor substrates are processed. The number 25 is an example.

Further, for example, it is also possible to perform cleaning according to the present invention whenever a membrane formation is finished by the third processing chamber 707, i.e., every semiconductor substrate having been processed. Further, the number of the membrane formation processes can be freely set up according to the thickness and other conditions of the membrane formation by the third processing chamber 707.

Further, as described above, in any of the cases, it is possible to reduce damage of the members made of such as quartz, AlN, and $Al_2O_3$ in the processing container of the substrate processor according to the cleaning method of the present invention.

Further, the present invention is not limited to the Embodiments, but variations and modifications may be made without departing from the scope of the present invention.

For example, the target film of cleaning according to the present invention is not limited to a W film, but the present invention is also applicable to other metals, metal nitrides, metal oxides, silicon, and silicon compounds as described above, providing the same effect as described concerning the Embodiments. Specifically, the present invention is equally applicable to cleaning WN, Ta, TaN, $Ta_2O_5$, Re, Rh, Ir, $Ir_2O_3$, Si, $SiO_2$, SiN, Ti, TiN, Ru, $RuO_2$, and so on, and the same effect as the Embodiments can be attained.

Further, the plasma excitation method of generating the radicals that contribute to cleaning is not limited to the method described in the Embodiments, but the frequency of the RF power may be in a range between 400 kHz and 3 GHz, providing the same effect as the Embodiments. Further, the temperature of the members at the time of cleaning can be may be between 30° C. and 600° C., and is desirably between 100° C. and 450° C. If the temperature of the members is set lower than 30° C., the etching rate of the cleaning target film remarkably falls. If the temperature of the members is set higher than 600° C., the members can be damaged.

According to the present invention, in cleaning of the substrate processor, fluorine molecules ($F_2$) are used instead of fluorine radicals (F*) that are conventionally used, the $F_2$ being obtained by recombining the fluorine radicals. Consequently, damage to the members in the substrate processing container, for example, damage of a quartz member due to the F radicals, are reduced, and a quartz member, which cannot be conventionally used, can be used. Furthermore, contamination of the thin film due to AlN, $Al_2O_3$, etc., being etched by the F radicals is reduced.

AVAILABILITY TO INDUSTRY

As described above, the cleaning method according to the present invention can be used by a substrate processor that forms membranes on a substrate, such as a semiconductor substrate, and it is suitable for removing the sediment in the substrate processing container accompanying the membrane formation process.

What is claimed is:

1. A method of cleaning a substrate processing container, comprising:
    a step of introducing fluorine compound gas into a remote plasma generating unit outside of the substrate processing container;
    a step of exciting the fluorine compound gas to generate fluorine radicals; and a step of maintaining the pressure in the substrate processing container at a predetermined pressure and introducing the fluorine radicals into the substrate processing container, wherein the predetermined pressure is one under which the fluorine radicals are recombined in the substrate processing container to generate fluorine molecule gas.

2. The cleaning method of the substrate processing container as claimed in claim 1, wherein the predetermined pressure is higher than 1333 Pa.

3. A method of cleaning a substrate processing container, comprising:

a step of preparing the substrate processing container having a shower head therein and a remote plasma generating unit outside of the substrate processing container;

a step of maintaining the shower head at a first temperature and supplying membrane formation gas through the shower head into the substrate processing container to form a membrane;

a step of introducing fluorine compound gas into the remote plasma generating unit;

a step of exciting the fluorine compound gas to generate fluorine radicals; and a step of maintaining the pressure in the substrate processing container at a predetermined pressure, maintaining the shower head at a second temperature and supplying the fluorine radicals into the shower head;

wherein the predetermined pressure is one under which the fluorine radicals are recombined in the substrate processing container to generate fluorine molecule gas.

4. The cleaning method of the substrate processing container as claimed in claim 3, wherein the predetermined pressure is higher than 1333 Pa.

5. The cleaning method of the substrate processing container as claimed in claim 3, wherein the second temperature is between 100° C. and 450° C.

6. The cleaning method of the substrate processing container as claimed in claim 1, wherein the predetermined pressure is one under which the etching rate of the fluorine compound gas including the fluorine molecule gas is substantially constant for metals and decreases for silicon oxides as the pressure increases.

7. The cleaning method of the substrate processing container as claimed in claim 3, wherein the predetermined pressure is one under which the etching rate of the fluorine compound gas including the fluorine molecule gas is substantially constant for metals and decreases for silicon oxides as the pressure increases.

* * * * *